United States Patent
Guo

(10) Patent No.: US 10,777,622 B2
(45) Date of Patent: Sep. 15, 2020

(54) ORGANIC LIGHT EMITTING DEVICE, DISPLAY APPARATUS, METHOD OF CONTROLLING COLOR TEMPERATURE OF LIGHT EMITTED FROM ORGANIC LIGHT EMITTING DEVICE, AND METHOD OF FABRICATING ORGANIC LIGHT EMITTING DEVICE

(71) Applicants: BOE TECHNOLOGY GROUP CO., LTD., Beijing (CN); Hefei BOE Optoelectronics Technology Co., Ltd., Hefei, Anhui (CN)

(72) Inventor: Yuanhui Guo, Beijing (CN)

(73) Assignees: BOE TECHNOLOGY GROUP CO., LTD., Beijing (CN); Hefei BOE Optoelectronics Technology Co., Ltd., Hefei, Anhui (CN)

( * ) Notice: Subject to any disclaimer, the term of this patent is extended or adjusted under 35 U.S.C. 154(b) by 136 days.

(21) Appl. No.: 15/767,450

(22) PCT Filed: Sep. 18, 2017

(86) PCT No.: PCT/CN2017/101996
§ 371 (c)(1),
(2) Date: Apr. 11, 2018

(87) PCT Pub. No.: WO2018/205477
PCT Pub. Date: Nov. 15, 2018

(65) Prior Publication Data
US 2019/0058018 A1    Feb. 21, 2019

(30) Foreign Application Priority Data
May 12, 2017 (CN) .......................... 2017 1 0335018

(51) Int. Cl.
*H01L 27/32* (2006.01)
*H01L 51/52* (2006.01)
(Continued)

(52) U.S. Cl.
CPC ...... *H01L 27/3232* (2013.01); *G02F 1/13439* (2013.01); *G02F 1/155* (2013.01);
(Continued)

(58) Field of Classification Search
CPC ......... E21B 7/205; E21D 11/38; E21D 9/005; E21D 9/008; E21D 9/0692;
(Continued)

(56) References Cited

U.S. PATENT DOCUMENTS

2007/0131949 A1    6/2007 Liu
2011/0304530 A1 *  12/2011 Yeh .................. G02B 27/2264
                                                                                 345/156
(Continued)

FOREIGN PATENT DOCUMENTS

CN    1556664 A    12/2004
CN    1776933 A    5/2006
(Continued)

OTHER PUBLICATIONS

International Search Report & Written Opinion dated Jan. 29, 2018, regarding PCT/CN2017/101996.
(Continued)

*Primary Examiner* — Joseph P Martinez
*Assistant Examiner* — Vipin Patel
(74) *Attorney, Agent, or Firm* — Intellectual Valley Law, P.C.

(57) ABSTRACT

The present application discloses an organic light emitting device. The organic light emitting device includes a first electrode; an organic layer an the first electrode, the organic layer having an organic light emitting layer; a second
(Continued)

electrode on a side of the organic layer distal to the first electrode; an electrochromic layer between the first electrode and the organic layer; and a third electrode between the electrochromic layer and the organic layer.

20 Claims, 4 Drawing Sheets

(51) Int. Cl.
| | |
|---|---|
| H01L 51/56 | (2006.01) |
| G02F 1/155 | (2006.01) |
| G02F 1/1343 | (2006.01) |
| G09G 3/20 | (2006.01) |
| G09G 3/3225 | (2016.01) |
| G02F 1/153 | (2006.01) |
| H01L 51/50 | (2006.01) |

(52) U.S. Cl.
CPC ......... *G02F 1/1533* (2013.01); *G09G 3/2003* (2013.01); *G09G 3/3225* (2013.01); *H01L 51/50* (2013.01); *H01L 51/52* (2013.01); *H01L 51/5209* (2013.01); *H01L 51/5218* (2013.01); *H01L 51/5225* (2013.01); *H01L 51/5234* (2013.01); *H01L 51/5265* (2013.01); *H01L 51/56* (2013.01); *G02F 2201/44* (2013.01); *G09G 2320/0666* (2013.01); *H01L 2251/301* (2013.01); *H01L 2251/5315* (2013.01); *H01L 2251/558* (2013.01)

(58) Field of Classification Search
CPC .... G02F 1/13439; G02F 1/1533; G02F 1/155; G02F 2201/44; G09G 2320/0666; G09G 3/2003; G09G 3/3225; H01L 2251/301; H01L 2251/5315; H01L 2251/558; H01L 27/3232; H01L 51/50; H01L 51/52; H01L 51/5209; H01L 51/5218; H01L 51/5225; H01L 51/5234; H01L 51/5265; H01L 51/56

See application file for complete search history.

(56) References Cited

U.S. PATENT DOCUMENTS

| | | |
|---|---|---|
| 2013/0127374 A1 | 5/2013 | Lin et al. |
| 2016/0225832 A1 | 8/2016 | Kwon et al. |
| 2016/0266459 A1* | 9/2016 | Oh .................... G02F 1/153 |
| 2017/0117505 A1 | 4/2017 | Kwon |

FOREIGN PATENT DOCUMENTS

| | | |
|---|---|---|
| CN | 102244201 A | 11/2011 |
| CN | 105280830 A | 1/2016 |
| CN | 105960717 A | 9/2016 |
| KR | 101471443 B1 | 12/2014 |
| KR | 20170049653 A | 5/2017 |

OTHER PUBLICATIONS

First Office Action in the Chinese Patent Application No. 201710335018.0, dated Mar. 21, 2019; English translation attached.

Second Office Action in the Korean Patent Application No. 20187011946, dated Apr. 11, 2019; English translation attached.

Third Office Action in the Chinese Patent Application No. 201710335018.0, dated May 13, 2019; English translation attached.

* cited by examiner

ORGANIC LIGHT EMITTING DEVICE, DISPLAY APPARATUS, METHOD OF CONTROLLING COLOR TEMPERATURE OF LIGHT EMITTED FROM ORGANIC LIGHT EMITTING DEVICE, AND METHOD OF FABRICATING ORGANIC LIGHT EMITTING DEVICE

CROSS-REFERENCE TO RELATED APPLICATION

This application is a national stage application under 35 U.S.C. § 371 of International Application No. PCT/CN2017/101996, filed Sep. 18, 2017, which claims priority to Chinese Patent Application No. 201710335018.0, filed May 12, 2017, the contents of which are incorporated by reference in the entirety.

TECHNICAL FIELD

The present invention relates to display technology, more particularly, to an organic light emitting device, display apparatus, a method of controlling color temperature of light emitted from an organic light emitting device, and a method of fabricating an organic light emitting device.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

An OLED display apparatus typically includes an anode, an organic layer including an organic light emitting layer, and a cathode. OLEDs can either be a bottom-emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. The cathode is optically transparent, while the anode is reflective.

SUMMARY

In one aspect, the present invention provides an organic light emitting device comprising a first electrode; an organic layer on the first electrode, the organic layer comprising an organic light emitting layer, a second electrode on a side of the organic layer distal to the first electrode; an electrochromic layer between the first electrode and the organic layer; and a third electrode between the electrochromic layer and the organic layer.

Optionally, a refractive index of the electrochromic layer is tunable.

Optionally, the organic light emitting device comprises a first microcavity in a first region corresponding to the third electrode; and a second microcavity in a second region, the second region corresponding to the first electrode and outside the first region; wherein a refractive index of the first microcavity is tunable.

Optionally, an effective optical distance of the first microcavity is adjustable by adjusting an electrical potential difference between the first electrode and the third electrode.

Optionally, the third electrode is formed substantially in the first region, the first electrode is formed substantially in the first region and the second region.

Optionally, the first electrode comprising a metallic material, the second electrode and the third electrode are substantially transparent electrodes.

Optionally, the first electrode comprises one or a combination of aluminum and silver.

Optionally, orthographic projections of the first electrode and the second electrode on a plane containing a surface of the first electrode cover orthographic projections of the electrochromic layer and the third electrode on the plane containing the surface of the first electrode.

Optionally, orthographic projections of the third electrode and the electrochromic layer substantially overlap with each other.

Optionally, the organic light emitting device further comprises a planarization layer between the third electrode and the organic layer.

Optionally, the planarization layer comprises a conductive polymer material.

Optionally, the planarization layer has a thickness in a range of approximately 100 nm to approximately 300 nm.

Optionally, the first electrode has a thickness in a range of approximately 10 nm to approximately 300 nm; the second electrode has a thickness in a range of approximately 10 nm to approximately 20 nm; and the third electrode has a thickness in a range of approximately 5 nm to approximately 20 nm.

Optionally, the electrochromic layer comprises one or a combination of tungsten oxide, a polythiophene electrochromic material or derivatives thereof a viologen electrochromic material or derivatives thereof, a tetrathiafulvalene electrochromic material or derivatives thereof, and a metal-phthalocyanine electrochromic material or derivatives thereof.

Optionally, the second electrode is a cathode, the first electrode and the third electrode are anodes.

In another aspect, the present invention provides a display apparatus comprising the organic light emitting device described herein or fabricated by a method described herein.

In another aspect, the present invention provides a method of controlling color temperature of light emitted from the organic light emitting device described herein or fabricated by a method described herein, comprising applying a first voltage signal to the first electrode; applying a second voltage signal to the second electrode; and applying a third voltage signal to the third electrode.

Optionally, the method further comprises adjusting color temperature of light emitted from the organic light emitting device by adjusting one or a combination of an electrical potential difference between the first electrode and the third electrode, an electrical potential difference between the second electrode and the third electrode, and an electrical potential difference between the first electrode and the second electrode.

Optionally, the organic light emitting device comprises a first microcavity in a first region corresponding to the third electrode; and a second microcavity in a second region, the second region outside the first region and corresponding to the first electrode, the method further comprises adjusting color temperature of light emitted from the first microcavity by adjusting one or a combination of an electrical potential difference between the first electrode and the third electrode and an electrical potential difference between the second electrode and the third electrode.

Optionally, the organic light emitting device comprises a first microcavity in a first region corresponding to the third electrode; and a second microcavity in a second region, the second region outside the first region and corresponding to the first electrode; the method further comprises adjusting color temperature of light emitted from the second microcavity by adjusting an electrical potential difference between the first electrode and the second electrode.

In another aspect, the present invention provides a method of fabricating an organic light emitting device, comprising forming a first electrode on a base substrate; forming an electrochromic layer on a side of the first electrode distal to the base substrate; forming a third electrode on a side of the electrochromic layer distal to the first electrode; forming an organic layer on a side of the third electrode and the first electrode distal to the base substrate; and forming a second electrode on a side of the organic layer distal to the first electrode; wherein forming the organic layer comprises forming an organic light emitting layer.

Optionally, the electrochromic layer and the third electrode are formed using a single mask plate in a single patterning process.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In conventional organic light emitting devices, color temperature of light emitted from the conventional organic light emitting devices can only be adjusted by adjusting the voltage applied to the organic light emitting devices. It is difficult to cover a full spectrum of color temperatures in the conventional organic light emitting devices. Moreover, a large color temperature adjustment requires a large voltage change between the anode and the cathode, resulting a relatively large change in light intensity of the emitted light.

Accordingly, the present disclosure provides, inter alia, an organic light emitting device, a display apparatus, a method of controlling color temperature of light emitted from an organic light emitting device, and a method of fabricating an organic light emitting device that substantially obviate one or more of the problems due to limitations and disadvantages of the related art. In one aspect, the present disclosure provides an organic light emitting device. In some embodiments, the organic light emitting device includes a first electrode; an organic layer on the first electrode; a second electrode on a side of the organic layer distal to the first electrode; an electrochromic layer between the first electrode and the organic layer, and a third electrode between the electrochromic layer and the organic layer. The organic layer includes an organic light emitting layer. Optionally, the third electrode and the electrochromic layer are formed substantially in a first region, the first electrode and the second electrode are formed substantially in a region greater than, and includes, the first region. Optionally, orthographic projections of the first electrode and the second electrode on a plane containing a surface of the first electrode cover orthographic projections of the electrochromic layer and the third electrode on the plane containing the surface of the first electrode. As compared to the conventional organic light emitting device, color temperature of light emitted from the present organic light emitting device can be adjusted over a relatively large range, without affecting the light intensity of the emitted light.

Figure 1A:
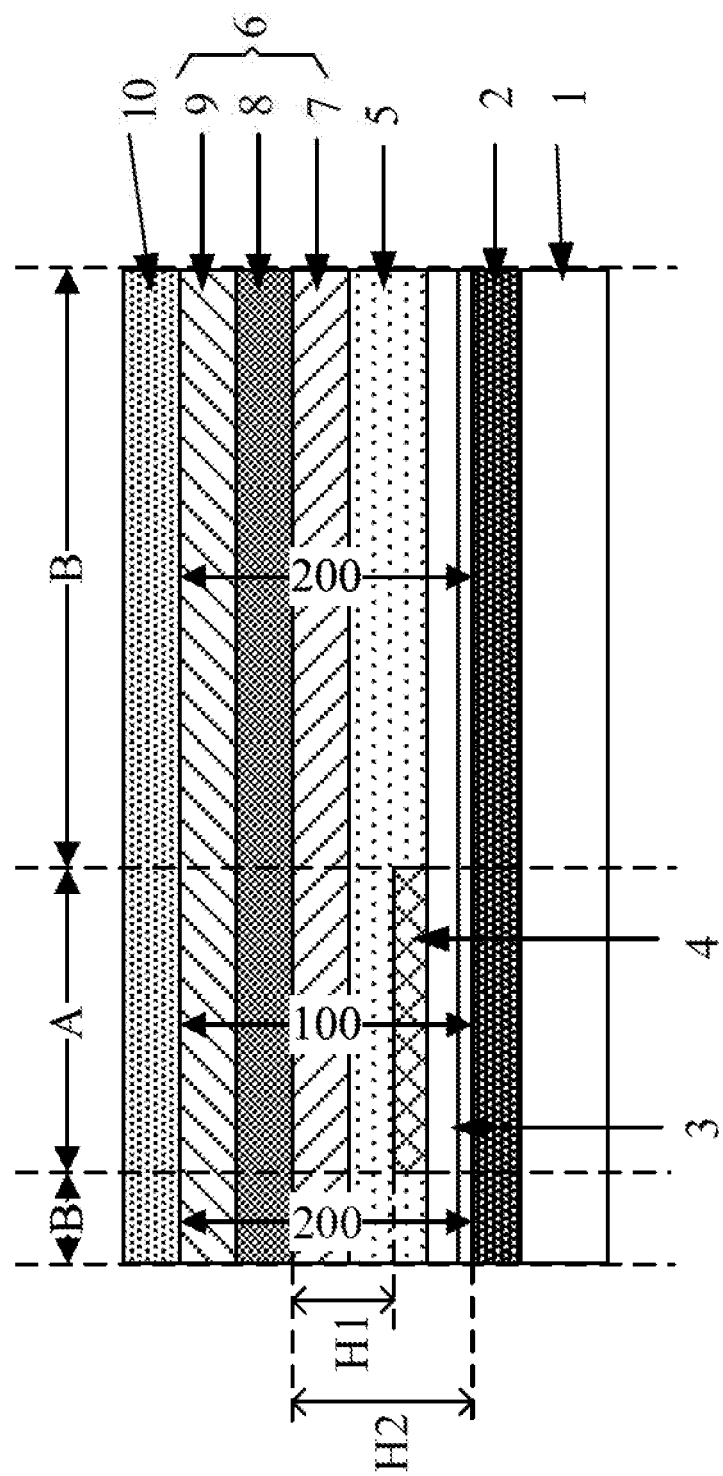
FIG. 1A is a schematic diagram illustrating the structure of an organic light emitting device in some embodiments according to the present disclosure.
Figure 1B:
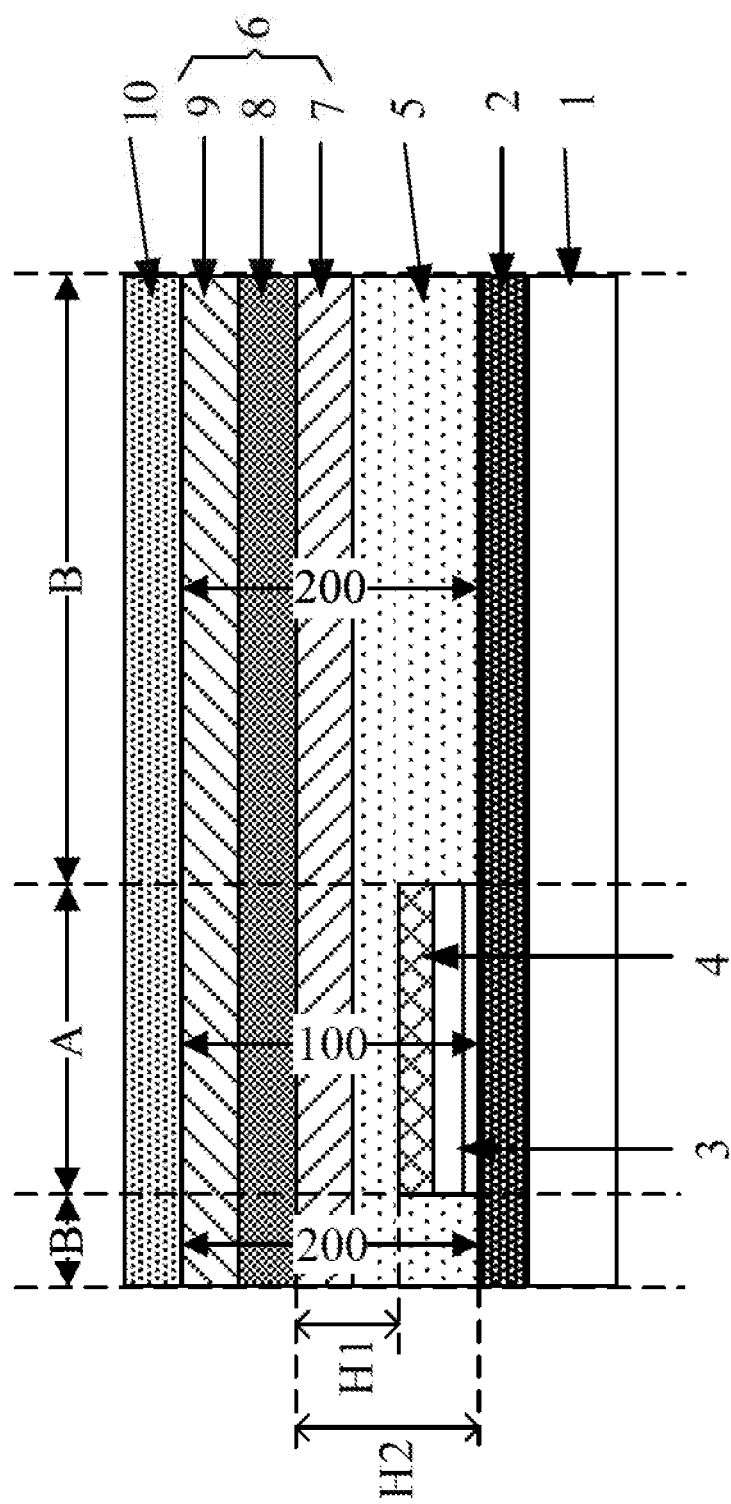
FIG. 1B is a schematic diagram illustrating the structure of an organic light emitting device in some embodiments according to the present disclosure.

FIG. 1A is a schematic diagram illustrating the structure of an organic light emitting device in some embodiments according to the present disclosure. FIG. 1B is a schematic diagram illustrating the structure of an organic light emitting device in some embodiments according to the present disclosure. Referring to FIG. 1A and FIG. 1B, the organic light emitting diode device in some embodiments includes a first electrode 2 on a base substrate 1; an electrochromic layer 3 on a side of the first electrode 2 distal to the base substrate 1; a third electrode 4 on a side of the electrochromic layer 3 distal to the first electrode 2; an organic layer 6 on a side of the third electrode 4 and the first electrode 2 distal to the base substrate 1; and a second electrode 10 on a side of the organic layer 6 distal to the first electrode 2.

Referring to FIG. 1A, in some embodiments, the third electrode 4 is substantially in a first region A. The first electrode 2 and the second electrode 10 are substantially in a region greater than, and includes, the first region A. For example, the first electrode 2 and the second electrode 10 in FIG. 1A are substantially in both the first region A and a second region B. The electrochromic layer 3 is not limited to the first region A. Optionally, the electrochromic layer 3 is substantially in a region greater than, and includes, the first region A. For example, the electrochromic layer 3 is substantially in both the first region A and a second region B. The electrochromic layer 3 is between the first electrode 2 and the third electrode 4. The third electrode 4 is between the electrochromic layer 3 and the organic layer 6. Optionally, orthographic projections of the first electrode 2, the second electrode 10, and the electrochromic layer 3 on a plane containing a surface (e.g., a bottom surface) of the first electrode 2 cover an orthographic projection of the third electrode 4 on the plane containing the surface of the first electrode 2.

Referring to FIG. 1B, in some embodiments, the third electrode 4 and the electrochromic layer 3 are substantially in a first region A. The first electrode 2 and the second electrode 10 are substantially in a region greater than, and includes, the first region. For example, the first electrode 2 and the second electrode 10 in FIG. 1B are substantially in both the first region A and a second region B. The electrochromic layer 3 is between the first electrode 2 and the third electrode 4. The third electrode 4 is between the electrochromic layer 3 and the organic layer 6. Optionally, orthographic projections of the first electrode 2 and the second electrode 10 on a plane containing a surface (e.g., a bottom surface) of the first electrode 2 cover orthographic projections of the electrochromic layer 3 and the third electrode 4 on the plane containing the surface of the first electrode 2. Optionally, orthographic projections of the third electrode 4 and the electrochromic layer 3 substantially overlap with each other.

In some embodiments, the organic light emitting device includes a first microcavity 100 in a first region A corresponding to the third electrode 4 (and the electrochromic layer 3), and a second microcavity 200 in a second region B. The second region B is outside the first region A and corresponding to a portion of the first electrode 2. Optionally, an optical distance of the first microcavity 100 is adjustable by adjusting an electrical potential difference between the first electrode 2 and the third electrode 4.

The electrochromic layer 3 is made of an electrochromic material. As used herein, the term "electrochromic" refers to a material or a layer that exhibits a stable and reversible change in its optical characteristics (e.g., one or more of reflectivity, transmissivity, absorbance, and refractive index) upon application of an electrical potential difference. Optionally, the electrochromic material or layer undergoes a color change upon application of an electrical potential difference. Optionally, the electrochromic material or layer undergoes a change in transparency upon application of an electrical potential difference. Optionally, the electrochromic material is an inorganic electrochromic material. Examples of inorganic electrochromic materials include transition metal oxides such as $WO_3$, $MoO_3$, $Nb_2O_3$. Examples of organic electrochromic materials include polythiophene and derivatives thereof viologen and derivatives thereof, tetrathiafulvalene and derivatives thereof metalphthalocyanine and derivatives thereof, pyridine, aminoquinone and azine compounds.

As shown in FIG. 1B, the electrochromic layer 3 in some embodiments includes a single electrochromic block (in each organic light emitting device). Optionally, the electrochromic layer 3 includes a plurality of electrochromic blocks, e.g., 2, 3, or more electrochromic blocks.

The organic layer 6 includes at least an organic light emitting layer 8. Upon applying voltage signals at the first electrode 2 and the second electrode 10, positive charge carriers (holes) and negative charge carriers (electrons) are generated, respectively. The positive charge carriers and negative charge carriers recombine in the organic light emitting layer 8, forming excitons. When the excitons return to the ground state, their energy is transferred to the organic light emitting material in the organic light emitting layer 8. The organic light emitting material is excited from the ground state to an excited state. When the organic light emitting material returns to the ground state, the energy is released in the form of light through radiative decay. Optionally, the organic light emitting layer 8 has a thickness in a range of approximately 5 nm to approximately 50 nm.

When an electric field is applied between the anode and the cathode to inject electrons from the cathode into the light emitting layer and holes from the anode into the light-emitting layer, the energy released from the recombination of the electrons and the holes can oscillate between excitons and photons at a certain oscillation frequency. Inside a microcavity, photons may be absorbed by the de-excited atoms. The de-excited atoms are then re-excited, and release photons when they return to the ground state. This process may be repeated multiple times inside the microcavity, resulting in an enhanced emission intensity at an emission peak.

In some embodiments, one of the first electrode 2 and the second electrode 10 is an anode, and the other one is a cathode. Upon the external electrical field, the anode generates positive charge carriers (holes), and the cathode generates negative charge carriers (electrons). Optionally, the first electrode 2 is an anode and the second electrode 10 is a cathode.

Optionally, the organic light emitting device is a top-emission type organic light emitting device. Optionally, the organic light emitting device is a bottom-emission type organic light emitting device.

In some embodiments, the first electrode 2 is made of a metallic material, and the second electrode 10 is made of a transparent material, e.g., the second electrode 10 is a transparent electrode. Optionally, the first electrode 2 made of the metallic material is a reflective mirror configured to reflect light emitted from the organic light emitting layer 8 along a direction toward the second electrode 10, the reflected light then passes through the second electrode 10. As used herein, the term "substantially transparent" mean at least 50 percent (e.g., at least 60 percent, at least 70 percent, at least 80 percent, at least 90 percent, and at least 95 percent) of light in the visible wavelength range transmitted therethrough.

Optionally, the first electrode 2 is made of aluminum, or silver, or a combination thereof. Optionally, the second electrode 10 is made of a transparent metal oxide such as indium tin oxide and indium zinc oxide.

In some embodiments, the third electrode 4 is made of a transparent material, e.g., the third electrode 4 is a transparent electrode. By having this design, the light emitted from the organic light emitting layer 8 can pass through the third electrode 4 and reach the first electrode 2, the light is then reflected by the first electrode 2 along a direction toward the second electrode 10. Optionally, the third electrode 4 is made of a transparent metal oxide such as indium tin oxide and indium zinc oxide.

In some embodiments, the third electrode 4 is an anode of the first microcavity 100, and the second electrode 10 is a cathode of the first microcavity 100; the first electrode 2 is an anode of the second microcavity 200, and the second electrode 10 is a cathode of the second microcavity 200. In some embodiments, the light intensity Ic(λ) along the length direction of the microcavity (e.g., a direction substantially perpendicular to the light emitting surface) can be determined by the following equation:

$$I_c(\lambda) = \frac{(1-R_d)\left[1 + R_m + 2\sqrt{R_m}\cos\left(\frac{4\pi x}{\lambda}\right)\right]}{1 + R_m R_d - 2\sqrt{R_m R_d}\cos\left(\frac{4\pi L}{\lambda}\right)} |E_n(\lambda)|^2; \quad (1)$$

wherein λ stands for a wavelength of the light emitted from the organic light emitting layer 8; x stands for a distance inside the microcavity between the organic light emitting layer 8 and the anode; $R_m$ stands for mirror reflectivity of a metal mirror (e.g., the first electrode 2); $R_d$ stands for mirror reflectivity of a dielectric mirror (e.g., a mirror made of a dielectric material such as silicon oxide and titanium oxide); L stands for an effective optical distance of the microcavity; $E_n(\lambda)$ stands for distribution of a raw spectrum (a free space spectrum).

The effective optical distance of the microcavity may be determined based on the following equation:

$$L = n_{org}d_{org} - \frac{\phi_1 + \phi_2}{4\pi}\lambda; \quad (2)$$

wherein $n_{org}$ stands for an effective refractive index of all layers in the microcavity $d_{org}$ stands for a total thickness of all layers in the microcavity; $\phi_1$ stands for reflective phase shift of the metal mirror, and $\phi_2$ stands for reflective phase shift of the dielectric mirror.

As used herein, the term "microcavity" refers to a resonant optical cavity in a solid-state light emitting device. For example, in the context of the present disclosure, the first electrode 2 and the second electrode 10 constitute two reflective mirrors in the microcavity. Optionally, the microcavity has an optical distance substantially equal to a sum of optical path lengths of layers between the first electrode 2 and the second electrode 10. As used herein, the term "optical path length" refers to a value obtained by multiplying a refractive index n of a medium through which the measurement light travels by a distance the measurement light travels through the medium having the refractive index n, i.e., the optical path length is equal to a distance the measurement light would travel through a vacuum during the time it takes for the measurement light to travel through the medium having the refractive index n.

Provided that the electrical potential difference between the anode and the cathode in the first microcavity 100 is substantially the same as the electrical potential difference between the anode and the cathode in the second microcavity 200, the wavelength of light emitted from the organic light emitting layer 8 in the first microcavity 100 would also be substantially the same as the wavelength of light emitted from the organic light emitting layer 8 in the second microcavity 200. Based on the equation (1) and the equation (2) above, under this condition, the light intensity of light emitted from the first microcavity 100 is different from the light intensity of light emitted from the second microcavity 200, because the distance H1 between the organic light emitting layer 8 to the anode (the third electrode 4) in the first microcavity 100 is different from the distance H2 between the organic light emitting layer 8 to the anode (the first electrode 2) in the second microcavity 200. When the electrical potential differences between the anode and the cathode in the first microcavity 100 and in the second microcavity 200 are substantially the same, the light emitted from the first microcavity 100 and the light emitted from the second microcavity 200 have different wavelengths and different color temperatures.

Because the distance H2 between the organic light emitting layer 8 to the anode (the first electrode 2) in the second microcavity 200 is greater than the distance H1 between the organic light emitting layer 8 to the anode (the third electrode 4) in the first microcavity 100, the light intensity of light emitted from the second microcavity 200 is greater than the light intensity of light emitted from the first microcavity 100 when the electrical potential differences between the anode and the cathode in the first microcavity 100 and in the second microcavity 200 are substantially the same. Under this condition, comparing the light emitted from the first microcavity 100 with the light emitted from the second microcavity 200, the light emitted from the second microcavity 200 has a higher spectral energy distribution on the longer wavelength side of the spectrum, a lower color temperature, and a red color shift; wherein the light emitted from the first microcavity 100 has a higher spectral energy distribution on the shorter wavelength side of the spectrum (e.g., the light emitted from the first microcavity 100 has a wavelength smaller than that of the light emitted from the second microcavity 200), a relatively higher color temperature, and a blue color shift. Thus, when the electrical potential differences between the anode and the cathode in the first microcavity 100 and in the second microcavity 200 are substantially the same, the light emitted from the first microcavity 100 and the light emitted from the second microcavity 200 have different color temperatures. Moreover, when the adjustment ranges of the electrical potential difference between the anode and the cathode in the first microcavity 100 and in the second microcavity 200 are substantially the same, the first microcavity 100 and the second microcavity 200 have different adjustment ranges of color temperature.

Accordingly, a composite light of the light emitted from the first microcavity 100 having a first color temperature and the light emitted from the second microcavity 200 having a second color temperature would have a third color temperature. The composite light having the third color temperature emits out of the organic light emitting device. Optionally, the first color temperature, the second color temperature, and the third color temperature are different each other. Thus, both the first color temperature and the second color temperature can affect the value of the third color temperature, effectively increasing the adjustment range of the color temperature of the light emitted from the organic light emitting device.

In the present organic light emitting device, color temperature of the light emitted from the organic light emitting device can be adjusted in multiple ways. First, by adjusting an electrical potential difference between the first electrode 2 and the second electrode 10, the light intensity $Ic(\lambda)$ along the length direction of the second microcavity 200 can be adjusted, thereby adjusting color temperature of the light emitted from the organic light emitting device.

Second, by adjusting an electrical potential difference between the third electrode 4 and the second electrode 10, color temperature of light emitted from the first microcavity 100 can be adjusted. Third, by adjusting an electrical potential difference between the third electrode 4 and the first electrode 2, color temperature of light emitted from the first microcavity 100 can also be adjusted.

In some embodiments, by adjusting an electrical potential difference between the third electrode 4 and the first electrode 2, the refractive index of the electrochromic layer 3, and the effective refractive index of all layers inside the first microcavity 100, can be adjusted. Based on the equation (2), the effective optical distance of the first microcavity 100, and the light intensity and color temperature of light emitted from the first microcavity 100, can also be adjusted by adjusting an electrical potential difference between the third electrode 4 and the first electrode 2.

By having the electrochromic layer 3 in the present organic light emitting device, the effective optical distance of the first microcavity 100 becomes adjustable, effectively increasing the adjustment range of color temperature of the light emitted from the first microcavity 100 and the light emitted from the organic light emitting device.

Because the light emitted from the organic light emitting device (having the third color temperature) is a composite light of the light emitted from the first microcavity 100 (having a first color temperature) and the light emitted from the second microcavity 200 (having a second color temperature), a change in the third color temperature is a composite of a change in the first color temperature and a change in the second color temperature. A relatively small change in the first color temperature and the second color temperature will result in a relatively large change in the third color temperature. Thus, a small change in the electrical potential difference between the anode and the cathode in the first microcavity 100 and the second microcavity 200 can result in a larger color temperature change without changing light intensity of the organic light emitting device too much.

Optionally, the first electrode 2 has a thickness in a range of approximately 10 n to approximately 300 nm, e.g., approximately 10 nm to approximately 100 urn, approximately 100 nm to approximately 200 nm, and approximately 200 urn to approximately 300 nm. By having the thickness of the first electrode 2 equal to or greater than 10 nm, the first electrode 2 can maintain a relatively high reflectivity. By having the thickness of the first electrode 2 equal to or less than 300 nm, the organic light emitting device can be made thinner.

Optionally, the second electrode 10 has a thickness in a range of approximately 10 nm to approximately 20 nm. Optionally, the third electrode 4 has a thickness in a range of approximately 5 nm to approximately 20 nm. By having the thicknesses of the second electrode 10 and the third electrode 4 in these ranges, the second electrode 10 and the third electrode 4 can maintain a relatively high conductivity and the organic light emitting device can be made thinner.

Referring to FIG. 1A and FIG. 1B, the organic layer 6 in some embodiments further includes a hole transport layer 7 and an electron transport layer 9. The hole transport layer 7 is between the third electrode 4 (anode) and the organic light emitting layer 8. The electron transport layer 9 is between the organic light emitting layer 8 and the second electrode 10 (cathode). The hole transport layer 7 enhances the hole transfer efficiency of the organic light emitting device. The electron transport layer 9 enhances the electron transfer efficiency of the organic light emitting device. Optionally, the hole transport layer 7 has a thickness in a range of approximately 5 nm to approximately 50 nm. Optionally, the electron transport layer 9 has a thickness in a range of approximately 5 nm to approximately 50 nm.

Referring to FIG. 1A and FIG. 1B, the organic light emitting device in some embodiments further includes a planarization layer 5 between the first electrode 2 and the organic layer 6, and between the third electrode 4 and the organic layer 6. Optionally, the planarization layer 5 includes a conductive polymer material. Examples of conductive polymer materials include poly(3,4-ethylenedioxythiophene) poly(styrenesulfonate) (PEDOT:PSS). The planarization layer 5 made of a conductive polymer material not only has a planarization function, but also conduct electricity and inject holes into the organic layer 6.

Optionally, the planarization layer 5 has a thickness in a range of approximately 100 nm to approximately 300 nm. By having the thickness of the planarization layer 5 equal to or greater than 100 nm, the planarization layer 5 can sufficiently planarize the organic light emitting device. By having the thickness of the planarization layer 5 equal to or less than 300 nm, the organic light emitting device can be made thinner.

In the present organic light emitting device, color temperature of light emitted from the organic light emitting device can be adjusted by adjusting an electrical potential difference between the second electrode 10 and the third electrode 4, and adjusting an electrical potential difference between the first electrode 2 and the second electrode 10. Moreover, the color temperature of light emitted from the organic light emitting device can be adjusted by adjusting an electrical potential difference between the first electrode 2 and the third electrode 4, which changes the refractive index of the electrochromic layer 3. As a result, the present organic light emitting device has a much larger adjustment range of color temperature.

In another aspect, the present disclosure provides a method of driving the organic light emitting device, e.g., a method of controlling color temperature of light emitted from the organic light emitting device. In some embodiments, the method includes applying a first voltage signal to the first electrode; applying a second voltage signal to the second electrode; and applying a third voltage signal to the third electrode. Optionally, the method further includes adjusting color temperature of light emitted from the organic light emitting device by adjusting color temperature of light emitted from the first microcavity, or adjusting color temperature of light emitted from the second microcavity, or both. Optionally, color temperature of light emitted from the first microcavity can be adjusted by adjusting an electrical potential difference between the first electrode and the third electrode. Optionally, color temperature of light emitted from the first microcavity can be adjusted by adjusting an electrical potential difference between the second electrode and the third electrode. Optionally, color temperature of light emitted from the second microcavity can be adjusted by adjusting an electrical potential difference between the first electrode and the second electrode. Optionally, color temperature of light emitted from the organic light emitting device is adjusted by a combination of adjusting the electrical potential difference between the first electrode and the third electrode, adjusting the electrical potential difference between the second electrode and the third electrode, and adjusting the electrical potential difference between the first electrode and the second electrode.

Figure 2:
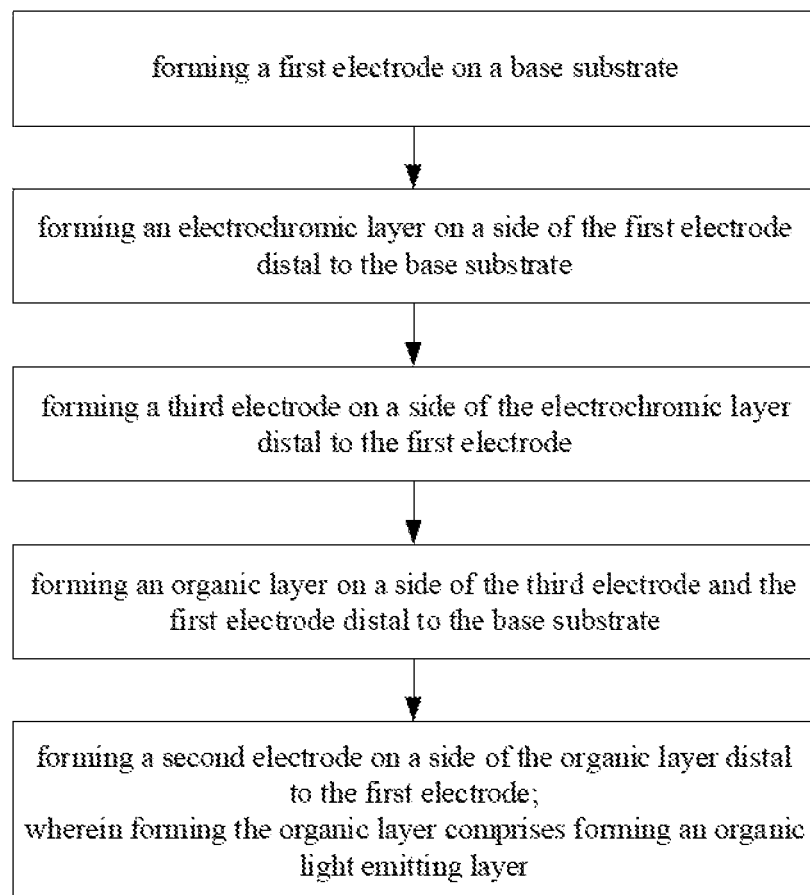
FIG. 2 is a flow chart illustrating a method of fabricating an organic light emitting device in some embodiments according to the present disclosure.

In another aspect, the present disclosure provides a method of fabricating an organic light emitting device. FIG. 2 is a flow chart illustrating a method of fabricating an organic light emitting device in some embodiments according to the present disclosure. Referring to FIG. 2, the method in some embodiments includes forming a first electrode on a base substrate; forming an electrochromic layer on a side of the first electrode distal to the base substrate; forming a third electrode on a side of the electrochromic layer distal to the first electrode; forming an organic layer on a side of the third electrode and the first electrode distal to the base substrate; and forming a second electrode on a side of the organic layer distal to the first electrode. The step of forming the organic layer includes forming an organic light emitting layer. Optionally, the organic light emitting device is formed so that orthographic projections of the first electrode and the second electrode on a plane containing a surface of the first electrode cover orthographic projections of the electrochromic layer and the third electrode on the plane containing the surface of the first electrode. Optionally, orthographic projections of the third electrode and the electrochromic layer substantially overlap with each other.

Various appropriate materials and various appropriate fabricating methods may be used to make the first electrode. For example, a metal material may be deposited by a plasma-enhanced chemical vapor deposition (PECVD) process or a sputtering process, e.g., a magnetron sputtering process. Optionally, the deposited metal material layer has a thickness in a range of approximately 10 nm to approximately 300 nm. The deposited metal material layer is then patterned, e.g., by a lithographic process. Examples of appropriate metal materials for making the first electrode include aluminum, silver, and a combination thereof.

Various appropriate materials and various appropriate fabricating methods may be used to make the electrochromic layer. For example, an electrochromic material may be deposited by a plasma-enhanced chemical vapor deposition (PECVD) process. The deposited electrochromic material layer is then patterned. e.g., by a lithographic process. Examples of appropriate electrochromic materials for making the electrochromic layer include tungsten oxide, a polythiophene electrochromic material or derivatives thereof, a viologen electrochromic material or derivatives thereof, a tetrathiafulvalene electrochromic material or derivatives thereof and a metal-phthalocyanine electrochromic material or derivatives thereof.

Various appropriate materials and various appropriate fabricating methods may be used to make the third electrode. For example, a transparent conductive material may be deposited by a plasma-enhanced chemical vapor deposition (PECVD) process or a sputtering process, e.g., a magnetron sputtering process. Optionally, the deposited conductive material layer has a thickness in a range of approximately 5 nm to approximately 20 nm. The deposited conductive material layer is then patterned, e.g., by a lithographic process. Examples of appropriate metal materials for making the third electrode include metal oxides such as indium tin oxide and indium zinc oxide.

Optionally, the electrochromic layer and the third electrode are patterned in a single process, e.g., using a single mask plate. Optionally, the electrochromic material layer is first deposited on the base substrate, and a transparent conductive material layer is then deposited on a side of the electrochromic layer distal to the base substrate. The electrochromic material layer and the transparent conductive material layer are patterned using a single mask plate, thereby obtaining the electrochromic layer and the third electrode.

Various appropriate materials and various appropriate fabricating methods may be used to make the organic light emitting layer. For example, an organic light emitting material may be deposited by a plasma-enhanced chemical vapor deposition (PECVD) process or a coating process. Optionally, the deposited organic light emitting material layer has a thickness in a range of approximately 5 nm to approximately 50 nm. The organic light emitting layer may have a single layer structure. Optionally, the light emitting layer has a multi-layer structure and including multiple sub-layers.

Optionally, the step of forming the organic layer further includes forming a hole transport layer, e.g., between the first electrode and the organic light emitting layer. Various appropriate materials and various appropriate fabricating methods may be used to make the hole transport layer. For example, a hole transport material may be deposited by a plasma-enhanced chemical vapor deposition (PECVD) process or a coating process. Optionally, the deposited hole transport material layer has a thickness in a range of approximately 5 nm to approximately 50 nm. Examples of appropriate hole transport materials include N,N'-Bis-(1-naphthalenyl)-N,N'-bis-phenyl-(1,1'-biphenyl)-4,4'-diamine (NPB).

Optionally, the step of forming the organic layer further includes forming an electron transport layer, e.g., between the organic light emitting layer and the second electrode. Various appropriate materials and various appropriate fabricating methods may be used to make the electron transport layer. For example, an electron transport material may be deposited by a plasma-enhanced chemical vapor deposition (PECVD) process or a coating process. Optionally, the deposited electron transport material layer has a thickness in a range of approximately 5 nm to approximately 50 nm. Examples of appropriate electron transport materials include 4,7-diphenyl-1,10-phenanthroline (Bphen).

Various appropriate materials and various appropriate fabricating methods may be used to make the second electrode. For example, a transparent conductive material may be deposited by a plasma-enhanced chemical vapor deposition (PECVD) process or a sputtering process, e.g., a magnetron sputtering process. Optionally, the deposited conductive material layer has a thickness in a range of approximately 10 nm to approximately 20 nm. The deposited conductive material layer is then patterned, e.g., by a lithographic process. Examples of appropriate metal materials for making the second electrode include metal oxides such as indium tin oxide and indium zinc oxide.

Optionally, the method further includes forming a planarization layer between the third electrode and the organic layer. Various appropriate materials and various appropriate fabricating methods may be used to make the planarization layer. For example, a planarization material may be deposited by a plasma-enhanced chemical vapor deposition (PECVD) process or a sputtering process, e.g., a magnetron sputtering process. Optionally, the deposited planarization material layer has a thickness in a range of approximately 100 nm to approximately 300 nm. The deposited planarization material layer is then patterned, e.g., by a lithographic process. Examples of appropriate metal materials for making the planarization layer include conductive polymer materials such as PEDOT:PSS.

Figure 3A:
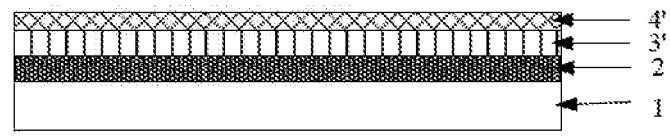
FIGS. 3A to 3D illustrate a process of fabricating an organic light emitting device in some embodiments according to the present disclosure.
Figure 3B:
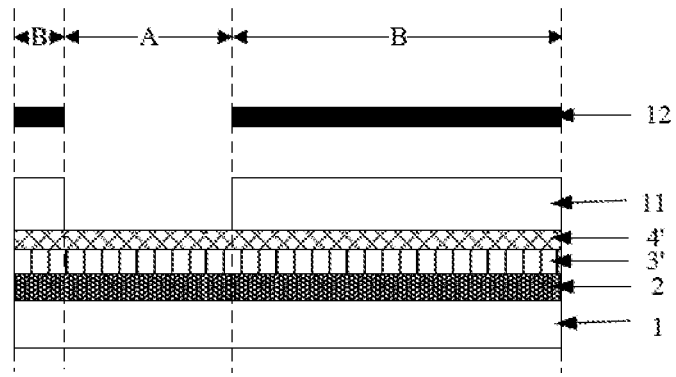
Figure 3C:
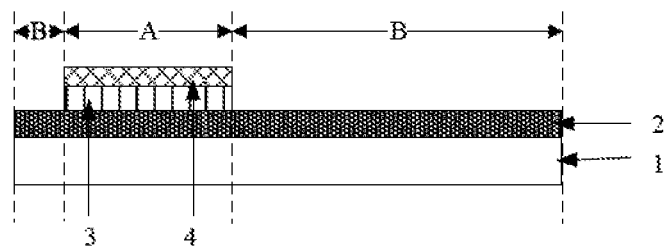
Figure 3D:
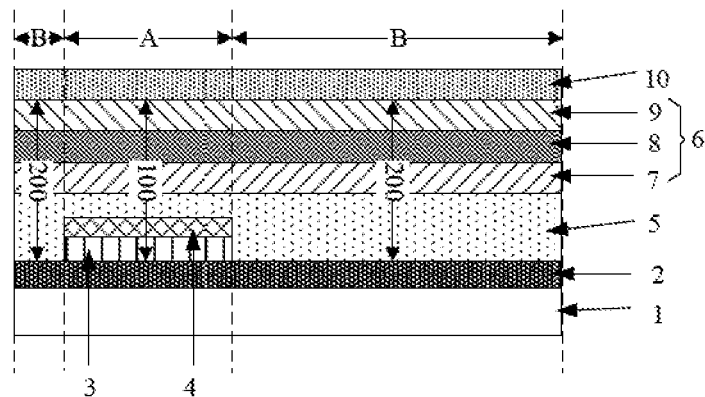

FIGS. 3A to 3D illustrate a process of fabricating an organic light emitting device in some embodiments according to the present disclosure. Referring to FIG. 3A, a first electrode 2 is formed on a base substrate 1, an etch stop material layer 3' is formed on a side of the first electrode 2 distal to the base substrate 1, and a transparent conductive material layer 4' is formed on a side of the etch stop material layer 3' distal to the first electrode 2. Referring to FIG. 3B, a photoresist layer 11 is formed on a side of the transparent conductive material layer 4' distal to the etch stop material layer 3'. The photoresist layer 11 has a photoresist pattern formed using a mask plate 12. The photoresist pattern has a first region A and a second region B. The photoresist material is removed in the first region A. Referring to FIG. 3C, the etch stop material layer 3' and the transparent conductive material layer 4' are then etched to remove the etch stop material and the transparent conductive material in the first region A, thereby forming the etch stop layer 2 and the third electrode 4 in the first region A. Referring to FIG. 3D, a planarization layer 5 is then formed on a side of the third electrode 4 distal to the base substrate 1 in the first region A, and on a side of the first electrode 2 distal to the base substrate 1 in the second region B. Subsequently, an organic layer 6 (including a hole transport layer 7, an organic light emitting layer 8, and an electron transport layer 9) is formed on a side of the planarization layer 5 distal to the base substrate 1, and a second electrode 10 is formed on a side of the organic layer 6 distal to the planarization layer 5.

In another aspect, the present disclosure provides a display panel having an organic light emitting device described herein or fabricated by a method described herein. In another aspect, the present disclosure provides a display apparatus having the organic light emitting device described herein or fabricated by a method described herein. Examples of appropriate display apparatus includes, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An organic light emitting device, comprising:
a first electrode;
an organic layer on the first electrode, the organic layer comprising an organic light emitting layer;
a second electrode on a side of the organic layer distal to the first electrode;
an electrochromic layer between the first electrode and the organic layer; and
a third electrode between the electrochromic layer and the organic layer;
wherein each of the first electrode, the second electrode, and the organic layer is in both a first region and a second region, the second region being outside of the first region;
the electrochromic layer is in at least the first region; and
the third electrode is limited in the first region and is absent in the second region.

2. The organic light emitting device of claim 1, wherein a refractive index of the electrochromic layer is tunable.

3. The organic light emitting device of claim 1, comprising a first microcavity limited in the first region to in which the third electrode is present; and
a second microcavity limited in the second region in which the third electrode is absent;
wherein a refractive index of the first microcavity is tunable.

4. The organic light emitting device of claim 3, wherein an effective optical distance of the first microcavity is adjustable by adjusting an electrical potential difference between the first electrode and the third electrode.

5. The organic light emitting device of claim 3, wherein the first microcavity extends from a side of the second electrode facing the first electrode to a side of the first electrode facing the second electrode, and extends through layers comprising the organic layer, the third electrode, and the electrochromic layer;
the second microcavity extends from the side of the second electrode facing the first electrode to the side of the first electrode facing the second electrode, and extends through layers comprising the organic layer; and
the third electrode is limited in the first microcavity and absent in the second microcavity.

6. The organic light emitting device of claim 1, wherein the first electrode comprising a metallic material, the second electrode and the third electrode are substantially transparent electrodes, and
the first electrode is a reflective layer.

7. The organic light emitting device of claim 1, wherein the first electrode comprises one or a combination of aluminum and silver.

8. The organic light emitting device of claim 1, wherein orthographic projections of the first electrode and the second electrode on a plane containing a surface of the first electrode cover orthographic projections of the electrochromic layer and the third electrode on the plane containing the surface of the first electrode.

9. The organic light emitting device of claim 1, wherein orthographic projections of the third electrode and the electrochromic layer substantially overlap with each other.

10. The organic light emitting device of claim 1, further comprising a planarization layer between the third electrode and the organic layer.

11. The organic light emitting device of claim 10, wherein the planarization layer comprises a conductive polymer material.

12. The organic light emitting device of claim 10, wherein the planarization layer has a thickness in a range of 100 nm to 300 nm.

13. The organic light emitting device of claim 1, wherein
the first electrode has a thickness in a range of 10 nm to 300 nm;
the second electrode has a thickness in a range of 10 nm to 20 nm; and
the third electrode has a thickness in a range of 5 nm to 20 nm.

14. The organic light emitting device of claim 1, wherein the electrochromic layer comprises one or a combination of tungsten oxide, a polythiophene electrochromic material or derivatives thereof, a viologen electrochromic material or derivatives thereof, a tetrathiafulvalene electrochromic material or derivatives thereof, and a metal-phthalocyanine electrochromic material or derivatives thereof.

15. A display apparatus, comprising the organic light emitting device of claim 1.

16. A method of controlling color temperature of light emitted from an organic light emitting device
wherein the organic light emitting device comprises:
a first electrode;
an organic layer on the first electrode, the organic layer comprising an organic light emitting layer;
a second electrode on a side of the organic layer distal to the first electrode;
an electrochromic layer between the first electrode and the organic layer; and
a third electrode between the electrochromic layer and the organic layer;
wherein each of the first electrode, the second electrode, and the organic layer is in both a first region and a second region, the second region being outside of the first region;
the electrochromic layer is in at least the first region; and the third electrode is limited in the first region and is absent in the second region;
wherein the method comprises:
applying a first voltage signal to the first electrode;
applying a second voltage signal to the second electrode; and
applying a third voltage signal to the third electrode.

17. The method of claim 16, further comprising adjusting color temperature of light emitted from the organic light emitting device by adjusting one or a combination of an electrical potential difference between the first electrode and the third electrode, an electrical potential difference between the second electrode and the third electrode, and an electrical potential difference between the first electrode and the second electrode.

18. The method of claim 16, wherein the organic light emitting device comprises a first microcavity in a first region corresponding to the third electrode; and
a second microcavity in a second region, the second region outside the first region and corresponding to the first electrode;
the method further comprises adjusting color temperature of light emitted from the first microcavity by adjusting one or a combination of an electrical potential difference between the first electrode and the third electrode and an electrical potential difference between the second electrode and the third electrode.

19. The method of claim 16, wherein the organic light emitting device comprises a first microcavity in a first region corresponding to the third electrode; and
a second microcavity in a second region, the second region outside the first region and corresponding to the first electrode;
the method further comprises adjusting color temperature of light emitted from the second microcavity by adjusting an electrical potential difference between the first electrode and the second electrode.

20. A method of fabricating an organic light emitting device, comprising:
forming a first electrode on a base substrate;
forming an electrochromic layer on a side of the first electrode distal to the base substrate;
forming a third electrode on a side of the electrochromic layer distal to the first electrode;
forming an organic layer on a side of the third electrode and the first electrode distal to the base substrate; and
forming a second electrode on a side of the organic layer distal to the first electrode;
wherein forming the organic layer comprises forming an organic light emitting layer; and
wherein the first electrode is formed in a first region and a second region, the second region being outside of the first region;
the organic layer is formed in the first region and the second region;
the second electrode is formed in the first region and the second region;
the electrochromic layer is formed at least in the first region; and
the third electrode is limited in the first region and is absent in the second region.

* * * * *